United States Patent
Orita et al.

(10) Patent No.: US 9,574,271 B2
(45) Date of Patent: Feb. 21, 2017

(54) METHOD FOR FORMING METAL OXIDE FILM, METAL OXIDE FILM AND APPARATUS FOR FORMING METAL OXIDE FILM

(75) Inventors: Hiroyuki Orita, Tokyo (JP); Takahiro Shirahata, Tokyo (JP); Akio Yoshida, Tokyo (JP); Shizuo Fujita, Kyoto (JP); Naoki Kameyama, Kyoto (JP); Toshiyuki Kawaharamura, Kochi (JP)

(73) Assignees: TOSHIBA MITSUBISHI-ELECTRIC INDUSTRIAL SYSTEMS CORPORATION, Tokyo (JP); KYOTO UNIVERSITY, Kyoto (JP)

( * ) Notice: Subject to any disclaimer, the term of this patent is extended or adjusted under 35 U.S.C. 154(b) by 1203 days.

(21) Appl. No.: 13/383,766

(22) PCT Filed: Sep. 2, 2009

(86) PCT No.: PCT/JP2009/065314
§ 371 (c)(1),
(2), (4) Date: Jan. 12, 2012

(87) PCT Pub. No.: WO2011/027425
PCT Pub. Date: Mar. 10, 2011

(65) Prior Publication Data
US 2012/0112187 A1  May 10, 2012

(51) Int. Cl.
C23C 16/00 (2006.01)
C23C 18/12 (2006.01)
(Continued)

(52) U.S. Cl.
CPC ....... *C23C 18/1216* (2013.01); *C23C 18/1258* (2013.01); *C23C 18/1291* (2013.01);
(Continued)

(58) Field of Classification Search
CPC ............ C23C 18/1212; C23C 18/1258; C23C 18/1291
See application file for complete search history.

(56) References Cited

U.S. PATENT DOCUMENTS 3,850,665 A * 11/1974 Plumat et al. ............... 428/432
4,497,667 A    2/1985 Vashi
(Continued)

FOREIGN PATENT DOCUMENTS

CN    1843934 A    10/2006
DE    2 233 594 A    1/1973
(Continued)

OTHER PUBLICATIONS

Ji et al. "Fabrication and characterization of p-type ZnO films by pyrolysis of zinc-acetate-ammonia solution", Journal of Crystal Grouth, vol. 253, pp. 239-242.*
(Continued)

*Primary Examiner* — Kelly M Gambetta
(74) *Attorney, Agent, or Firm* — Oblon, McClelland, Maier & Neustadt, L.L.P.

(57) ABSTRACT

The present method of forming a metal oxide film can increase production efficiency while maintaining the low resistance of the metal oxide film. The present method of forming a metal oxide film includes first misting a solution containing a metallic element and ethylenediamine; meanwhile, heating a substrate; and then, supplying the misted solution onto a first main surface of the substrate.

12 Claims, 5 Drawing Sheets

(51) Int. Cl.
  *H01L 31/18*   (2006.01)
  *H01G 9/20*    (2006.01)
  *H01L 29/786*  (2006.01)

(52) U.S. Cl.
  CPC ....... *H01L 31/1884* (2013.01); *H01G 9/2031* (2013.01); *H01L 29/7869* (2013.01); *Y02E 10/50* (2013.01)

(56) References Cited

U.S. PATENT DOCUMENTS

| | | | |
|---|---|---|---|
| 5,094,882 A * | 3/1992 | Platts | 427/168 |
| 6,235,112 B1 * | 5/2001 | Satoh | C23C 16/4408 117/102 |
| 2003/0020157 A1 | 1/2003 | Natori et al. | |
| 2003/0021079 A1 | 1/2003 | Natori et al. | |
| 2004/0161608 A1 | 8/2004 | Choi et al. | |
| 2006/0051601 A1 | 3/2006 | Natori et al. | |
| 2006/0099409 A1 | 5/2006 | Choi et al. | |
| 2006/0120940 A1 | 6/2006 | Natori et al. | |
| 2007/0026580 A1 * | 2/2007 | Fujii | H01L 21/0271 438/149 |
| 2008/0159939 A1 | 7/2008 | Natori et al. | |
| 2009/0230821 A1 | 9/2009 | Natori et al. | |
| 2010/0207492 A1 | 8/2010 | Natori et al. | |
| 2010/0289384 A1 | 11/2010 | Natori et al. | |
| 2011/0143053 A1 | 6/2011 | Shirahata et al. | |
| 2011/0151619 A1 | 6/2011 | Orita et al. | |
| 2012/0040083 A1 | 2/2012 | Orita et al. | |

FOREIGN PATENT DOCUMENTS

| | | | |
|---|---|---|---|
| DE | 691 11 770 T2 | | 12/1995 |
| DE | 10 2004 008 875 A1 | | 9/2004 |
| EP | 1 321 539 A2 | | 6/2003 |
| GB | 1 397 741 A | | 6/1975 |
| GB | 2 024 096 A | | 1/1980 |
| JP | 55-6586 A | | 1/1980 |
| JP | 60 39171 | | 2/1985 |
| JP | 60-039171 A | * | 2/1985 |
| JP | 09-59089 A | | 3/1997 |
| JP | 09-195050 A | | 7/1997 |
| JP | 2671384 B2 | | 10/1997 |
| JP | 10-195086 A | | 7/1998 |
| JP | 2000-239846 A | | 9/2000 |
| JP | 2000239846 A | * | 9/2000 |
| JP | 2002 146536 | | 5/2002 |
| JP | 2004-335607 A | | 11/2004 |
| JP | 2005 264230 | | 9/2005 |
| JP | 2005-264230 A | * | 9/2005 |
| JP | 2006 160600 | | 6/2006 |
| JP | 2007 144297 | | 6/2007 |
| JP | 2007-242340 A | | 9/2007 |
| JP | 2008-078113 | | 4/2008 |
| JP | 2010-084179 A | | 4/2010 |
| WO | WO 02/102712 A1 | | 12/2002 |
| WO | WO 2010/035312 A1 | | 4/2010 |
| WO | WO 2010/035313 A1 | | 4/2010 |

OTHER PUBLICATIONS

Combined Chinese Office Action and Search Report issued May 31, 2013, in Chinese Patent Application No. 200980161287.3 with Japanese translation, Partial English translation of Office Action and English translation of Search Report.

Office Action issued Jul. 9, 2013, in Japanese Patent Application No. 2011-529718 with English translation.

Yoshitake Masuda, et al., "High c-Axis Oriented Stand-Alone ZnO Self-Assembled Film", Crystal Growth & Design, vol. 8, No. 1, Dec. 1, 2007, pp. 275-279.

Zhenguo Ji, et al., "Fabrication and Characterization of p-type ZnO films by pyrolysis of zinc-acetate-ammonia solution", Journal of Crystal Growth, 253, 2003, pp. 239-242.

Arturo I. Martinez, et al., "Effect of the fluorine content on the structural and electrical properties of $SnO_2$ and ZnO—$SnO_2$ thin films prepared by spray pyrolysis" Thin Solid Films, vol. 483, Feb. 5, 2005, pp. 107-113.

M. de la L. Olvera, et al. "ZnO:F thin films deposited by chemical spray: effect of the fluorine concentration in the starting solution" Solar Energy Materials & Solar Cells, vol. 73, 2002, pp. 425-433.

U.S. Appl. No. 14/131,128, filed Jan. 6, 2014, Orita, et al.

International Search Report Issued Oct. 13, 2009 in PCT/JP09/65314 Filed Sep. 2, 2009.

International Prelimnary Report on Patentability Issued Mar. 20, 2012 in PCT/JP09/65314 Filed Sep. 2, 2009.

* cited by examiner

METHOD FOR FORMING METAL OXIDE FILM, METAL OXIDE FILM AND APPARATUS FOR FORMING METAL OXIDE FILM

TECHNICAL FIELD

The present invention relates to a film formation method of forming a metal oxide film on a substrate and a film formation apparatus for forming a metal oxide film, which is capable of performing the film formation method for a metal oxide film. Further, the present invention relates to a metal oxide film to be formed by the film formation method for a metal oxide film.

BACKGROUND ART

In the fields of solar batteries, light emitting devices, touch panels, and the like, metal oxide films are formed on substrates. Conventionally, as non-vacuum film formation techniques for forming a metal oxide film on a substrate, there are techniques disclosed in Patent Documents 1, 2 and 3.

In the technique disclosed in Patent Document 1, a metal oxide film is formed on a substrate by bringing the substrate which is heated into contact with a solution in which metal salt or a metal complex is dissolved. In this case, the solution contains at least one of an oxidizing agent and a reducing agent.

In the technique disclosed in Patent Document 2, tetrabutyltin or a tin tetrachloride solution with hydrogen peroxide added as an oxidizing agent is sprayed onto a preheated substrate and decomposed by heat. Then, after the substrate temperature decreased by the spraying of the solution is recovered, the solution is repeatedly sprayed. By this operation, a tin oxide thin film is grown on a surface of the substrate.

In the technique disclosed in Patent Document 3, a thin film material dissolved in a volatile solvent is intermittently sprayed from the above onto a substrate which is held while being heated and a transparent conductive film is thereby formed on a surface of the substrate. In this case, the intermittent spray is a high velocity pulsed intermittent spray in which the spraying time is 100 ms or less at a time.

PRIOR-ART DOCUMENTS

Patent Documents

[Patent Document 1] Japanese Patent Application Laid Open Gazette No. 2006-160600
[Patent Document 2] Japanese Patent Application Laid Open Gazette No. 2002-146536
[Patent Document 3] Japanese Patent Application Laid Open Gazette No. 2007-144297

DISCLOSURE OF INVENTION

Problems to be Solved by the Invention

It is desired now to provide a film formation method which is capable of increasing production efficiency while maintaining the low resistance of a metal oxide film to be formed.

Then, it is an object of the present invention to provide a method of forming a metal oxide film, which is capable of increasing production efficiency while maintaining the low resistance of a metal oxide film to be formed, and an apparatus for forming a metal oxide film, which is capable of performing the film formation method. Further, it is another object of the present invention to provide a metal oxide film to be formed by the method of forming a metal oxide film.

Means for Solving the Problems

The present invention is intended for a method of forming a metal oxide film and an apparatus for forming a metal oxide film in order to achieve the above objects. According to the present invention, a solution containing a metallic element and ethylenediamine is misted. Meanwhile, a substrate is heated. Then, the misted solution is supplied onto a first main surface of the substrate which is being heated.

Effects of the Invention

According to the present invention, in the method of forming a metal oxide film and the apparatus for forming a metal oxide film, the misted solution containing the metallic element is supplied onto the first main surface of the substrate while being heated. The solution also contains ethylenediamine.

Therefore, it is possible to increase production efficiency of the metal oxide film while maintaining the low resistance of the metal oxide film to be formed.

These and other objects, features, aspects and advantages of the present invention will become more apparent from the following detailed description of the present invention when taken in conjunction with the accompanying drawings.

BEST MODE FOR CARRYING OUT THE INVENTION

Hereinafter, the present invention will be specifically discussed with reference to figures showing the preferred embodiments.

The First Preferred Embodiment

Figure 1:
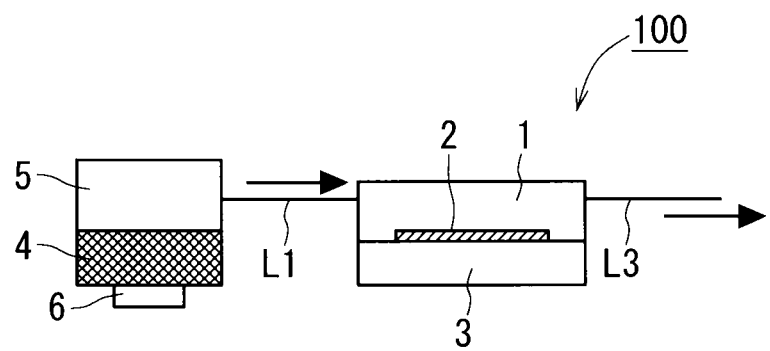
FIG. 1 is a view showing an overall configuration of a film formation apparatus in accordance with a first preferred embodiment.

FIG. 1 is a view showing an overall configuration of a film formation apparatus for forming a metal oxide film in accordance with the first preferred embodiment.

As shown in FIG. 1, the film formation apparatus 100 for forming a metal oxide film in accordance with the first preferred embodiment consists of a reaction chamber 1, a heating unit 3, a solution container 5, and a misting unit 6.

The film formation apparatus 100 performs a spray pyrolysis process, a pyrosol process, a mist deposition process, or the like. Specifically, in the film formation apparatus 100, a predetermined metal oxide film can be formed on a first main surface of the substrate 2 by spraying a predetermined misted solution onto the first main surface of the substrate 2.

While the substrate 2 is placed on the heating unit 3, the metal oxide film is formed on the first main surface of the substrate 2 by a predetermined reaction caused in the reaction chamber 1. While the substrate 2 is placed on the heating unit 3, a second main surface of the substrate 2 is in contact with the heating unit 3. As is clear from the above description, the first main surface of the substrate 2 in this specification refers to the main surface of the substrate 2 on which the metal oxide film is to be formed. On the other hand, the second main surface of the substrate 2 in this specification refers to the main surface of the substrate 2 on the side of the heating unit 3 when the substrate 2 is placed on the heating unit 3.

In this case, the metal oxide film may be formed on the substrate 2 under atmospheric pressure while the inside of the reaction chamber 1 is kept at atmospheric pressure, or the metal oxide film may be formed on the substrate 2 under reduced pressure while the air pressure inside the reaction chamber 1 is reduced to a range from 0.0001 to 0.1 MPa.

As the substrate 2, a glass substrate, a plastic substrate, a resin film, or the like, which is used in the fields of solar batteries, light emitting devices, touch panels, flat panel displays such as liquid crystal panels and the like, may be adopted.

The heating unit 3 is a heater or the like, for heating the substrate 2 placed thereon. The heating temperature of the heating unit 3 is controlled by an external control part and in the film formation process, the heating unit 3 is heated up to the film formation temperature of the metal oxide film.

The inside of the solution container 5 is filled with a material solution (hereinafter, referred to simply as "solution") 4 in which metal salt, a metal complex, or a metal alkoxide compound is dissolved as a metal source. The metal source contained in the solution 4 may be arbitrarily selected in accordance with the use of the metal oxide film to be formed. As the metal source, for example, titanium (Ti), zinc (Zn), indium (In), and tin (Sn), or at least one of these elements may be adopted.

Further, the solution 4 may not contain a dopant source described later. It is preferable, however, that the solution 4 should contain at least one of the following metallic elements, i.e., boron (B), nitrogen (N), fluorine (F), magnesium (Mg), aluminum (Al), phosphorus (P), chlorine (Cl), gallium (Ga), arsenic (As), niobium (Nb), indium (In), and antimony (Sb), as the dopant source.

As a solvent of the solution 4, water, alcohol such as ethanol, methanol or the like, a mixed solution of these liquids, or the like may be adopted.

In the present invention, the solution 4 also contains ethylenediamine (hereinafter, referred to as "EDA").

Figure 2:
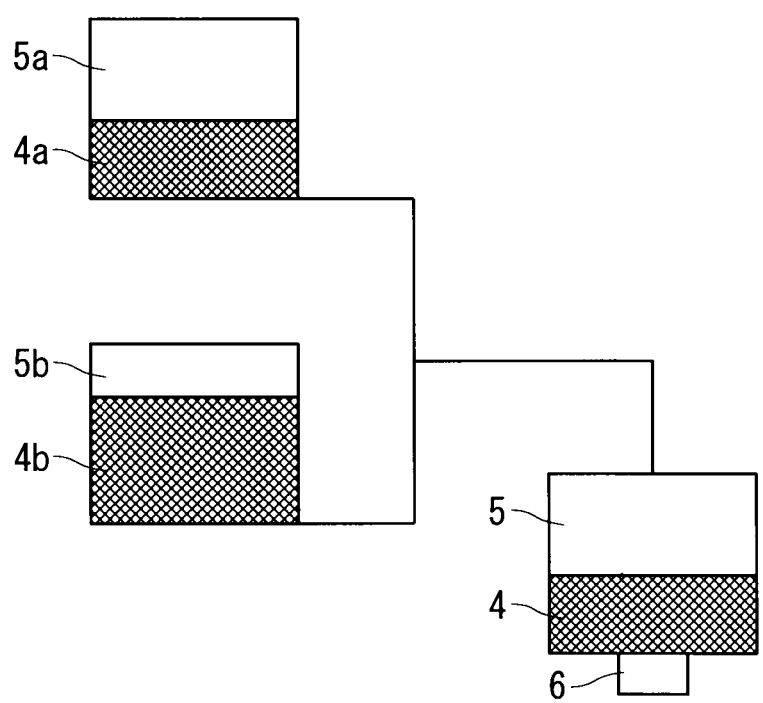
FIG. 2 is a view for explanation on a method of making a solution containing EDA (ethylenediamine) in a specified amount.

As shown in FIG. 2, the film formation apparatus 100 additionally comprises containers 5a and 5b. The container 5a holds an EDA solution 4a. On the other hand, the container 5b holds components of the solution 4 other than the EDA solution 4a, i.e., a solution (hereinafter, referred to as "source solution") 4b consisting of the above-discussed metal source and the above-discussed solvent or/and the above-discussed dopant source.

In order to make the solution 4, an external operation is performed on the film formation apparatus 100. The operation is performed so as to control and determine the EDA content in the solution 4. By performing the operation on a predetermined operation part in the film formation apparatus 100, a predetermined amount of EDA solution 4a is outputted from the container 5a and another predetermined amount of source solution 4b is outputted from the container 5b. Therefore, the EDA solution 4a and the source solution 4b which are outputted are supplied to the solution container 5 and in the solution container 5, the solution 4 contains the EDA in the amount determined by the above operation is thereby made.

As the misting unit 6, for example, an ultrasonic atomizer may be adopted. The misting unit 6 which is the ultrasonic atomizer applies ultrasound to the solution 4 in the solution container 5, to thereby mist the solution 4 in the solution container 5. The misted solution 4 is supplied through a path L1 toward the first main surface of the substrate 2 in the reaction chamber 1.

By supplying the misted solution 4 into the reaction chamber 1, the solution 4 is reacted on the substrate 2 which is being heated and the predetermined metal oxide film is thereby formed on the first main surface of the substrate 2. The metal oxide film to be formed is a transparent conductive film formed of, for example, indium oxide, zinc oxide, tin oxide, or the like, depending on the kind of solution 4. The unreacted solution 4 in the reaction chamber 1 is always (continuously) discharged from the reaction chamber 1 through a path L3.

Next, discussion will be made on a method of forming a metal oxide film in accordance with the first preferred embodiment.

First, by mixing the EDA solution 4a and the source solution 4b, the solution 4 is made.

Specifically, the film formation apparatus 100 comprises a predetermined operation part used for the input and selection of the EDA content in the solution 4. A user operates the operation part to input or select a desired value as the EDA content. Then, the EDA solution 4a in a first amount in accordance with the above operation is outputted from the container 5a. On the other hand, the source solution 4b in a second amount in accordance with the above operation is outputted from the container 5b. The EDA solution 4a and source solution 4b which are outputted are supplied to the solution container 5, and the solution 4 is thereby made in the solution container 5. In this case, the EDA content in the solution 4 is a desired value specified by the above operation performed on the operation part.

Figure 3:
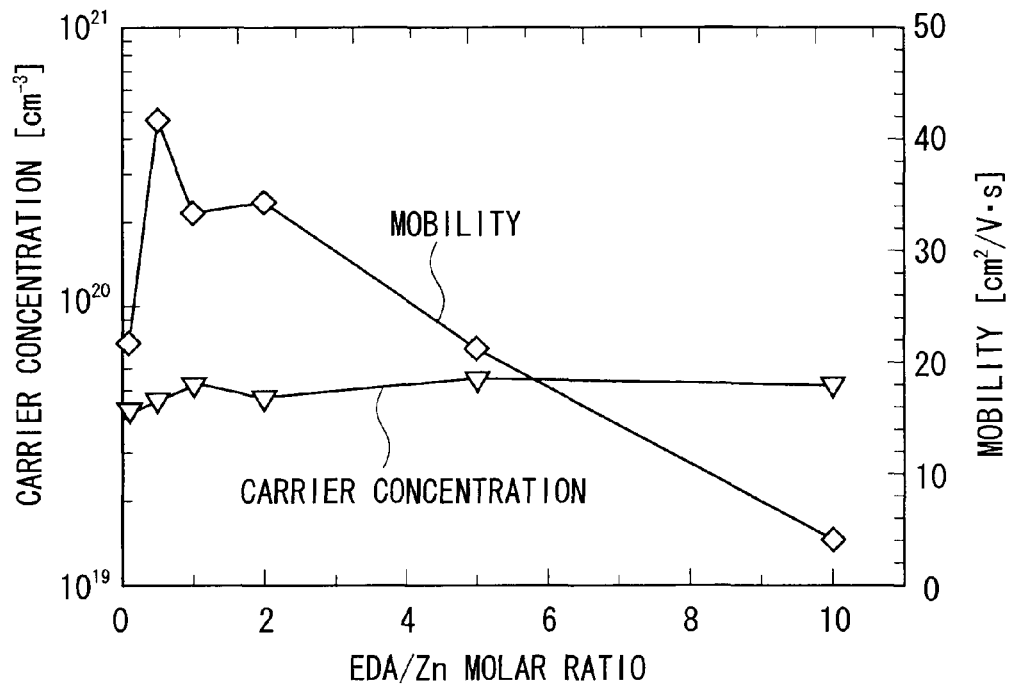
FIG. 3 is a graph showing a relation among the EDA content, the carrier concentration, and the mobility, which are used for determining the EDA content in the solution 4.
Figure 4:
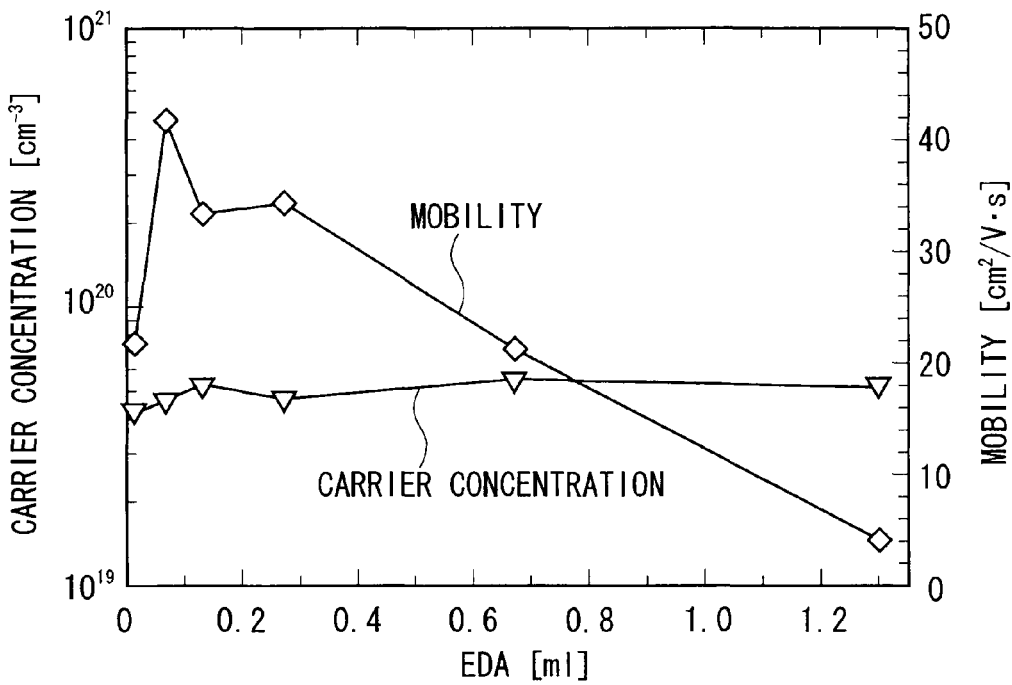
FIG. 4 is a graph showing a relation among the EDA content, the carrier concentration, and the mobility, which are used for determining the EDA content in the solution 4.

The inventors found that there is such a relation as shown in FIGS. 3 and 4, among the EDA content in the solution 4, the carrier concentration of the metal oxide film to be formed, and the mobility of the metal oxide film to be formed. FIGS. 3 and 4 do not show data in the case where the EDA content is 0.

The vertical axis on the left side in FIGS. 3 and 4 represents the carrier concentration ($cm^{-3}$) of the metal oxide film to be formed. The vertical axis on the right side in FIGS. 3 and 4 represents the mobility ($cm^2V \cdot s$) of the metal oxide film to be formed. The horizontal axis of FIG. 3 represents the ratio (molar ratio) of the number of moles of EDA to the number of moles of zinc (Zn). The horizontal axis of FIG. 4 represents the EDA content (ml) in the solution 4. The "square mark" in FIGS. 3 and 4 represents a data value indicating a relation between the EDA content and the mobility. The "triangle mark" in FIGS. 3 and 4 represents a data value indicating a relation between the EDA content and the carrier concentration.

In this case, as the "source solution" 4b in FIGS. 3 and 4, adopted is a mixed solution of 10 ml of water and 90 ml of methanol with zinc acetylacetonate added therein, where the solution molarity of zinc is 0.02 mol/L.

It can be seen from FIG. 3 that as the EDA content in the solution 4 increases relatively to the amount of zinc contained as the metal source, the mobility of the metal oxide film to be formed changes as follows. Specifically, when the EDA content relative to the zinc content is small, the mobility sharply increases, and after the mobility reaches the peak, as the EDA content relative to the zinc content increases, the mobility gradually decreases. It also can be seen from FIG. 3 that even when the EDA content in the solution 4 changes relatively to the amount of zinc contained as the metal source, the carrier concentration of the metal oxide film to be formed does not significantly change.

It can be seen from FIG. 4 that as the EDA content in the solution 4 increases, the mobility of the metal oxide film to be formed changes as follows. Specifically, when the EDA content is small, the mobility sharply increases, and after the mobility reaches the peak, as the EDA content increases, the mobility gradually decreases. It also can be seen from FIG. 4 that even when the EDA content in the solution 4 changes, the carrier concentration of the metal oxide film to be formed does not significantly change.

As well known, the resistivity of the metal oxide film to be formed is in proportion to the reciprocal of the carrier concentration×the mobility.

Therefore, before the process for making the solution 4, the data on the relation among the EDA content, the mobility, and the carrier concentration as shown in FIGS. 3 and 4 is prepared in advance. Then, the user takes account of the physical properties (e.g., transmittance) of the metal oxide film which are changed with the changes of the resistivity, the mobility, and the carrier concentration of the metal oxide film to be formed. In the operation for inputting or selecting the above-discussed EDA content, the user uses the data on the relation among the EDA content, the mobility, and the carrier concentration which is prepared in advance, taking account of the physical properties, to thereby determine the EDA content in the solution 4 in accordance with the use of the metal oxide film to be formed.

After the solution 4 is made in the solution container 5, the solution 4 is misted by the misting unit 6 in the solution container 5. The misted solution 4 is supplied into the reaction chamber 1 through the path L1.

Meanwhile, the substrate 2 placed on the heating unit 3 is heated by the heating unit 3 up to the film formation temperature of the metal oxide film, and then the temperature of the substrate 2 is kept at the film formation temperature of the metal oxide film. For example, the temperature of the substrate 2 is kept at about 300° C.

The misted solution 4 is supplied onto the first main surface of the substrate 2 which is being heated. The predetermined metal oxide film is thereby formed on the first main surface of the substrate 2 placed in the reaction chamber 1.

In the film formation process, in order to form the metal oxide film on the substrate 2, the substrate 2 may be placed under atmospheric pressure and supplied with the solution 4. In contrast to this, there may be another case where the film formation apparatus 100 additionally comprises a vacuum pump (not shown) for decompressing the inside of the reaction chamber 1 and the substrate 2 placed under reduced pressure (e.g., 0.0001 to 0.1 MPa) is supplied with the solution 4 in order to form the metal oxide film on the substrate 2.

As discussed above, in the method of forming a metal oxide film in accordance with the first preferred embodiment, the solution 4 containing the EDA as well as the metallic element is misted. Then, in the reaction chamber 1, the misted solution 4 is brought into contact with the substrate 2 which is being heated.

Figure 5:
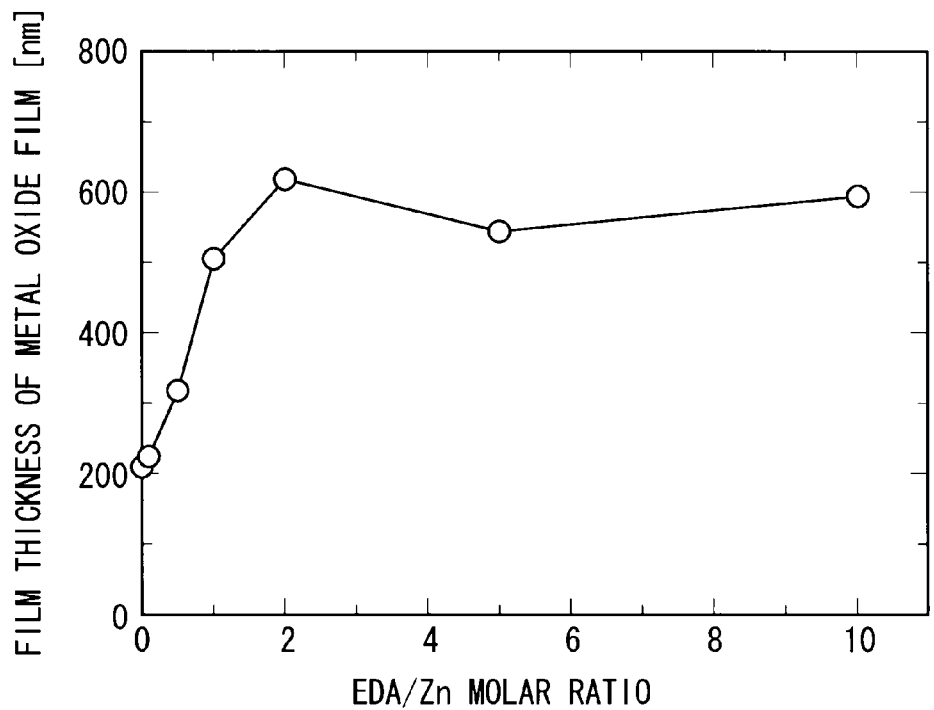
FIG. 5 is a graph for explanation on an effect in a case where a film formation method in accordance with the first preferred embodiment is adopted.
Figure 6:
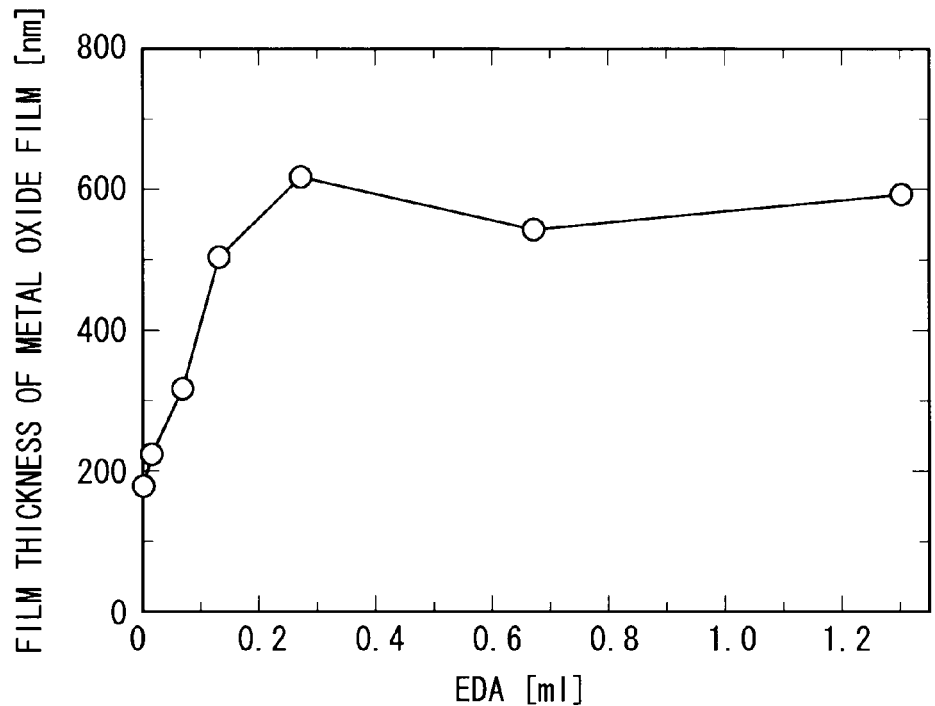
FIG. 6 is a graph for explanation on the effect in the case where the film formation method in accordance with the first preferred embodiment is adopted.

Therefore, it is possible to increase production efficiency of the metal oxide film while maintaining the low resistance of the metal oxide film to be formed. FIGS. 5 and 6 are graphs showing experimental data for explanation of the effect.

FIG. 5 shows a result of a measurement of the film thickness of the formed metal oxide film, which is performed as the ratio of the number of moles of EDA to the number of moles of zinc (Zn) contained in the solution 4 is changed. The vertical axis of FIG. 5 represents the film thickness (nm) of the metal oxide film which is formed, and the horizontal axis of FIG. 5 represents the molar ratio expressed by the number of moles of EDA/the number of moles of zinc (Zn).

FIG. 6 shows a result of a measurement of the film thickness of the formed metal oxide film, which is performed as the amount of EDA solution 4a in the solution 4 is changed. The vertical axis of FIG. 6 represents the film thickness (nm) of the metal oxide film which is formed, and the horizontal axis of FIG. 6 represents the amount (ml) of EDA solution 4a contained in the solution 4.

In FIGS. 5 and 6, only the EDA content in the solution 4 is changed and the respective amounts of the other components contained in the solution 4 are not changed. The conditions for the formation of the metal oxide film (the heating temperature (300° C.) of the substrate 2, the air pressure (atmospheric pressure) in the reaction chamber 1, the reaction time for film formation (thirty minutes), and the like) are the same for both the data of FIGS. 5 and 6.

As the source solution 4b in FIGS. 5 and 6, adopted is a mixed solution of water and methanol nine times as much as the water, with zinc acetylacetonate added therein, where the solution molarity of zinc is 0.02 mol/L.

As can be seen from the results shown in FIGS. 5 and 6, by using the solution 4 containing the EDA, the film formation rate of the metal oxide film is increased. In the cases of FIGS. 5 and 6, for example, by using the solution 4 containing the EDA, the film formation rate is increased up to about three times as high as that in the case where no EDA is contained. The effect of increasing the film formation rate is confirmed even when the conditions for the film formation and the components other than the EDA in the solution 4 are changed.

Since the film formation rate increases, the metal oxide film having a predetermined film thickness can be formed in a shorter time. The increase of the film formation rate means that the production efficiency of the metal oxide film is increased with the EDA contained in the solution 4.

Further, in the case of FIG. 5, when the molar ratio of EDA to zinc (Zn) is not lower than "1", the film formation rate of the metal oxide film is more markedly increased. In the case of FIG. 6, when the amount of the EDA solution 4a contained in the solution 4 is not smaller than "0.13 (ml)", the film formation rate of the metal oxide film is more markedly increased.

Figure 7:
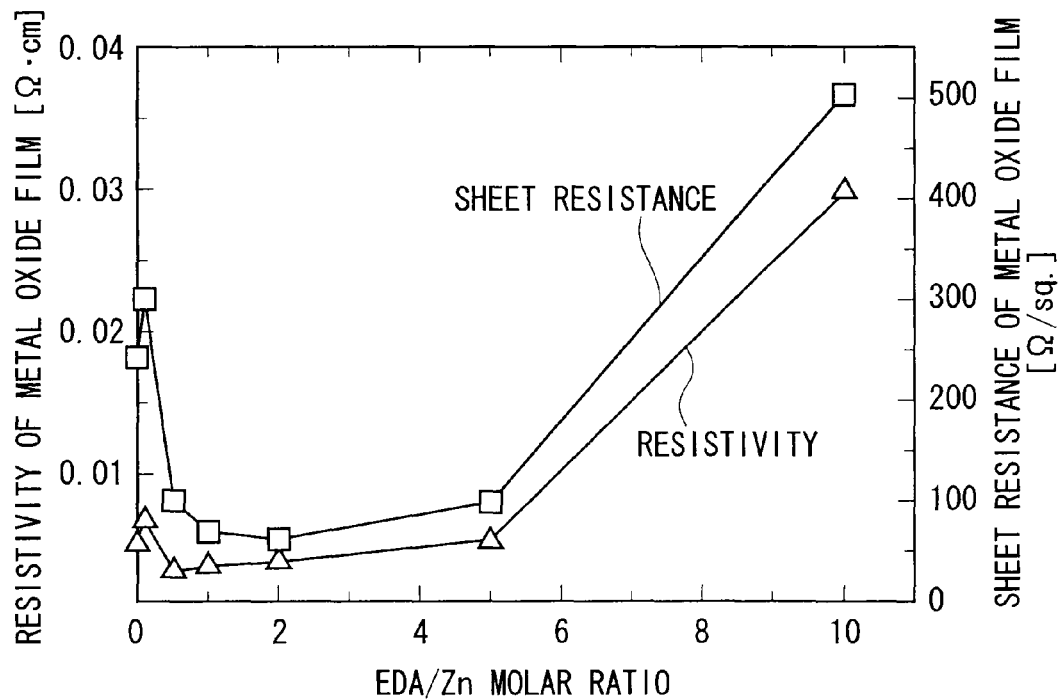
FIG. 7 is a graph for explanation on the effect in the case where the film formation method in accordance with the first preferred embodiment is adopted.
Figure 8:
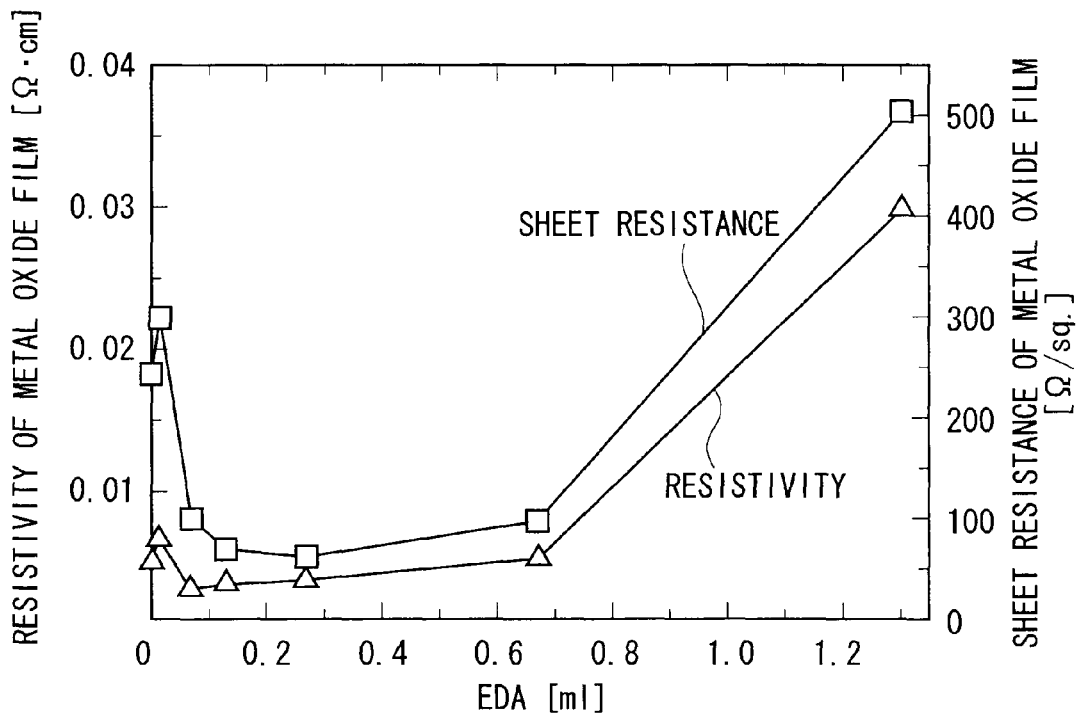
FIG. 8 is a graph for explanation on the effect in the case where the film formation method in accordance with the first preferred embodiment is adopted.

It can be seen from experimental data shown in FIGS. 7 and 8 that the sheet resistance of the formed metal oxide film is kept low also when an appropriate amount of EDA is contained in the solution 4.

FIG. 7 shows a result of a measurement of the resistivity and the sheet resistance of the formed metal oxide film, which is performed as the ratio of the number of moles of EDA to the number of moles of zinc (Zn) contained in the solution 4 is changed. The vertical axis on the left side in FIG. 7 represents the resistivity ($\Omega \cdot cm$) of the metal oxide film which is formed, and the vertical axis on the right side in FIG. 7 represents the sheet resistance ($\Omega/sq.$) of the metal oxide film which is formed. The horizontal axis of FIG. 7 represents the molar ratio expressed by the number of moles of EDA/the number of moles of zinc (Zn).

FIG. 8 shows a result of a measurement of the resistivity and the sheet resistance of the formed metal oxide film, which is performed as the amount of EDA solution 4a in the solution 4 is changed. The vertical axis on the left side in FIG. 8 represents the resistivity ($\Omega \cdot cm$) of the metal oxide film which is formed, and the vertical axis on the right side in FIG. 8 represents the sheet resistance ($\Omega/sq.$) of the metal oxide film which is formed. The horizontal axis of FIG. 8 represents the amount (ml) of EDA solution 4a contained in the solution 4.

In FIGS. 7 and 8, only the EDA content in the solution 4 is changed and the respective amounts of the other components contained in the solution 4 are not changed. The conditions for the formation of the metal oxide film (the heating temperature (300° C.) of the substrate 2, the air pressure (atmospheric pressure) in the reaction chamber 1, the reaction time for film formation (thirty minutes), and the like) are the same for both the data of FIGS. 7 and 8.

As the source solution 4b in FIGS. 7 and 8, adopted is a mixed solution of water and methanol nine times as much as the water, with zinc acetylacetonate added therein, where the solution molarity of zinc is 0.02 mol/L.

As can be seen from the results shown in FIGS. 7 and 8, when an appropriate amount of EDA is contained in the solution 4, the sheet resistance and the resistivity of the metal oxide film to be formed are lower than those in the case where no EDA is contained. As shown in FIGS. 7 and 8, when the metal oxide film is formed by using the solution 4 containing a large amount of EDA, the sheet resistance and the resistivity of the metal oxide film to be formed become high. From this result, in terms of reduction in the sheet resistance and the resistivity of the metal oxide film to be formed, the EDA content in the solution 4 should not become large. The effect of reducing the sheet resistance and the resistivity, which is caused by using the solution 4 containing the EDA, is confirmed also when the conditions for the film formation and the components other than the EDA in the solution 4 are changed.

It is possible, generally, to increase the film formation rate of the metal oxide film by increasing the amount of metal source which is a dissolved substance in a solution which does not contain EDA. When the above method in which the amount of metal source to be contained is increased is adopted, however, the resistivity and the sheet resistance of the metal oxide film to be formed are considerably deteriorated.

In contrast to this, in the first preferred embodiment, by using the solution 4 containing the EDA, it becomes possible to increase the film formation rate of the metal oxide film while maintaining the low resistance of the metal oxide film to be formed, as discussed with reference to FIGS. 5 to 8.

Further, in the case of FIG. 7, when the molar ratio of EDA to zinc (Zn) is in a range "from 0.5 to 5", the sheet resistance and the resistivity of the metal oxide film decrease. In the case of FIG. 8, when the amount of the EDA solution 4a contained in the solution 4 is in a range "from 0.067 to 0.67 (ml)", the sheet resistance and the resistivity of the metal oxide film decrease.

Furthermore, in the first preferred embodiment, the data on the relation among the EDA content, the mobility, and the carrier concentration shown in FIGS. 3 and 4 is prepared in advance and the EDA content in the solution 4 is determined by using the data.

Therefore, it is possible to provide the metal oxide film having an appropriate property value in accordance with the use of the metal oxide film to be formed.

For example, when the carrier concentration and the mobility increase, the resistivity of the metal oxide film to be formed is improved (or decreased). On the other hand, when the carrier concentration increases, the transmittance of the metal oxide film to be formed is decreased especially in an infrared region. In a case where the metal oxide film is to be used as a transparent conductive film of a solar battery which absorbs not only visible light but also infrared beams of light to generate electric power, such as a CIGS (Copper Indium Gallium DiSelenide) solar battery, low resistance and high transmittance also in the infrared region are required. In order to form a transparent conductive film to be used for such a solar battery, data on the relation among the EDA content, the mobility, and the carrier concentration of the transparent conductive film is prepared in advance, and such a EDA content in the solution 4 as to make the carrier concentration low and make the resistance value small is determined by using the data.

Thus, as shown in the first preferred embodiment, by controlling the EDA content in the solution 4, it is possible to control the carrier concentration and the mobility of the metal oxide film to be formed and consequently possible to provide the metal oxide film having a property value appropriate to the use of the metal oxide film.

As the metal source contained in the solution 4, at least one of titanium, zinc, indium, and tin can be adopted. When any of these metal sources is adopted, the transparent conductive film can be formed on the substrate 2.

Further, in the solution 4 containing titanium, zinc, indium, and tin, one of boron, nitrogen, fluorine, magnesium, aluminum, phosphorus, chlorine, gallium, arsenic, niobium, indium, and antimony may be at least contained as a dopant.

Depending on the kind of dopant, the metal oxide film (transparent conductive film) which is an N-type semiconductor can be brought into an electron-richer state. In this case, it becomes possible to more decrease the electric resistance of the metal oxide film (transparent conductive film) to be formed. Further, depending on the kind of dopant, a metal oxide film which is a P-type semiconductor can be formed. The metal oxide film of P-type semiconductor in which a hole becomes a carrier becomes conductive and becomes more available as a light emitting device than as a transparent conductive film.

As discussed above, the metal oxide film may be formed on the substrate 2 under atmospheric pressure while the inside of the reaction chamber 1 is kept at atmospheric pressure. In this case, since some constituent element such as a vacuum unit or the like can be omitted, it is possible to reduce the cost for the film formation apparatus 100.

In contrast to this, as discussed above, a vacuum pump or the like for decompressing the inside of the reaction chamber 1 may be provided. Then, while the air pressure inside the reaction chamber 1 is reduced to 0.0001 to 0.1 MPa, the metal oxide film may be formed on the substrate 2 under the reduced pressure. In this case, though the cost for the film formation apparatus 100 increases, a metal oxide film of better quality can be formed on the substrate 2 as compared with the case where the metal oxide film is formed under atmospheric pressure.

The effect of increasing the film formation rate while maintaining the low resistance of the metal oxide film can be produced also when the solution 4 contains ammonia. In order to produce the effect, however, it is necessary to use the solution 4 containing a large amount of ammonia. In contrast to this, in the present invention, it is possible to produce the above effect "of increasing the film formation rate while maintaining the low resistance of the metal oxide film" (which is almost the same as that in the case where the solution 4 containing ammonia) by using the solution 4 containing only a small amount of EDA (the amount is one tenth or less of the amount of ammonia to be contained).

On the other hand, it is not possible to produce the above effect when trimethylenediamine (TMDA) which is an amine compound like ammonia and EDA, instead of EDA, is contained in the solution 4. In other words, even when the solution 4 containing TMDA is used, the film formation rate is not increased. Further, when the solution 4 containing TMDA is used, the resistivity of the formed metal oxide film is increased and the sheet resistance of the metal oxide film is largely increased.

The Second Preferred Embodiment

Figure 9:
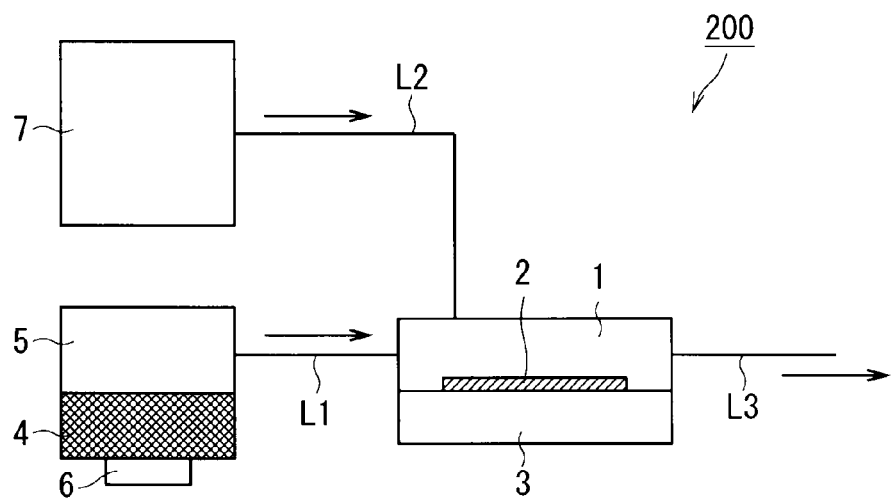
FIG. 9 is a view showing an overall configuration of a film formation apparatus in accordance with a second preferred embodiment.

FIG. 9 is a view showing an overall configuration of a film formation apparatus for forming a metal oxide film in accordance with the second preferred embodiment.

As can be seen from a comparison between FIG. 1 and FIG. 9, the film formation apparatus 200 for forming a metal oxide film in accordance with the second preferred embodiment has a configuration in which an ozone generator 7 is additionally provided to the configuration of the film formation apparatus 100 for forming a metal oxide film in accordance with the first preferred embodiment. Further, in the film formation apparatus 200, a path L2 is provided to supply ozone from the ozone generator 7 to the reaction chamber 1.

The constitution of the film formation apparatus 200 is the same as that of the film formation apparatus 100 except the addition of the ozone generator 7 and the path L2. Therefore, see the first preferred embodiment on the constituent elements other than the ozone generator 7 and the path L2.

The ozone generator 7 can generate ozone. The ozone generated by the ozone generator 7 is supplied onto the first main surface of the substrate 2 in the reaction chamber 1 through the path L2 different from the path L1. In the ozone generator 7, for example, high voltage is applied between parallel electrodes which are arranged in parallel and oxygen is supplied between the parallel electrodes. Then, the oxygen molecule is decomposed and bound to the other one, to thereby generate ozone.

By supplying the ozone and the misted solution 4 into the reaction chamber 1, the ozone and the solution 4 are reacted with each other on the substrate 2 which is being heated, to thereby form a predetermined metal oxide film on the first main surface of the substrate 2. The metal oxide film to be formed is a transparent conductive film formed of, for example, indium oxide, zinc oxide, tin oxide, or the like, depending on the kind of the solution 4. In this case, the ozone and the solution 4 which are unreacted in the reaction chamber 1 are always (continuously) discharged from the reaction chamber 1 through the path L3.

Next, discussion will be made on a method of forming a metal oxide film in accordance with the second preferred embodiment.

First, as discussed in the first preferred embodiment (see FIGS. 2, 3 and 4), the EDA content in the solution 4 is determined. Then, the solution 4 containing EDA in the amount determined thus is made in the solution container 5.

After the solution 4 is made in the solution container 5, the solution 4 is misted by the misting unit 6 in the solution container 5. The misted solution 4 is supplied into the reaction chamber 1 through the path L1. Further, ozone is generated by the ozone generator 7. The ozone which is generated is supplied into the reaction chamber 1 through the path L2.

Meanwhile, the substrate 2 placed on the heating unit 3 is heated by the heating unit 3 up to the film formation temperature of the metal oxide film, and then the temperature of the substrate 2 is kept at the film formation temperature of the metal oxide film. For example, the temperature of the substrate 2 is kept at 220° C. or less.

The ozone and the misted solution 4 are supplied onto the first main surface of the substrate 2 which is being heated. When the ozone and the misted solution 4 come into contact with the substrate 2 which is being heated, the ozone is decomposed by heat and oxygen radical is thereby generated. The oxygen radical promotes the decomposition of the solution 4 and the predetermined metal oxide film is thereby formed on the first main surface of the substrate 2.

In the film formation process, in order to form the metal oxide film on the substrate 2, the substrate 2 may be placed under atmospheric pressure and supplied with the solution 4 and the ozone. In contrast to this, there may be another case where the film formation apparatus 200 additionally comprises a vacuum pump (not shown) for decompressing the inside of the reaction chamber 1 and the substrate 2 placed under reduced pressure (e.g., 0.0001 to 0.1 MPa) is supplied with the solution 4 and the ozone in order to form the metal oxide film on the substrate 2.

As discussed above, in the method of forming a metal oxide film in accordance with the second preferred embodiment, the solution 4 containing the metallic element and the EDA is misted. Then, in the reaction chamber 1 in the atmosphere containing the ozone, the misted solution 4 is brought into contact with the substrate 2 which is being heated.

Therefore, since ozone and active oxygen generated by decomposition of ozone which is caused by heat or the like are very reactive, decomposition and oxidation of the material compound in the solution 4 is promoted. The metal oxide film can be thereby formed on the substrate 2 which is being heated even at low temperature. Ozone starts decomposing at room temperature, and as the heating temperature for the substrate 2 rises, the decomposition rate increases. When the heating temperature for the substrate 2 reaches about 200° C., the self-decomposition rate becomes several seconds. Therefore, even while the substrate 2 is heated at low temperature in a range from the room temperature to about 200° C., the metal oxide film can be formed on the substrate 2.

Figure 10:
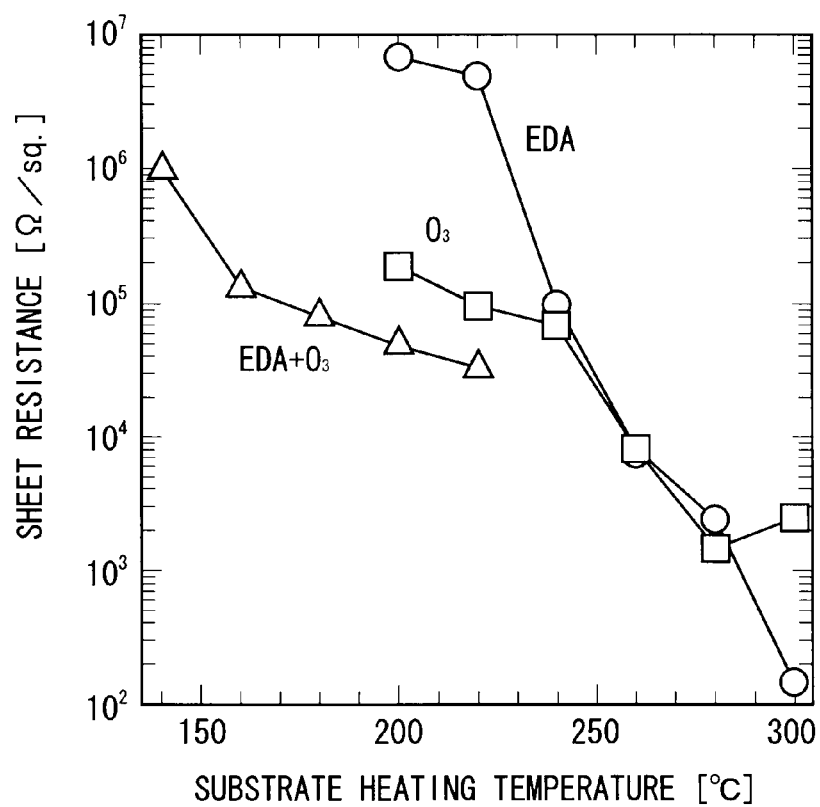
FIG. 10 is a graph for explanation on an effect in a case where a film formation method in accordance with the second preferred embodiment is adopted.

Further, by adopting the method of forming in accordance with the second preferred embodiment, in a low heating temperature region (e.g., 220° C. or lower) for the substrate 2, the sheet resistance of the metal oxide film to be formed can be made lower, as compared with the case of the first preferred embodiment. FIG. 10 is a graph showing experimental data indicating the effect of the second preferred embodiment.

The vertical axis of FIG. 10 represents the sheet resistance (Ω/sq.) of the metal oxide film to be formed and the horizontal axis of FIG. 10 represents the heating temperature (° C.) for the substrate 2. The data represented by "circle mark" in FIG. 10 indicates a relation between the heating temperature for the substrate 2 and the sheet resistance of the metal oxide film to be formed in a case where the solution 4 containing the EDA (without ozone) is supplied onto the substrate 2 in the reaction chamber 1, i.e., the case of the first preferred embodiment. The data represented by "triangle mark" indicates a relation between the heating temperature for the substrate 2 and the sheet resistance of the metal oxide film to be formed in a case where the ozone and the solution 4 containing the EDA are supplied onto the substrate 2 in the reaction chamber 1, i.e., the case of the second preferred embodiment. The data represented by "square mark" indicates a relation between the heating temperature for the substrate 2 and the sheet resistance of the metal oxide film to be formed in a case where the ozone and the solution 4 not containing the EDA are supplied onto the substrate 2 in the reaction chamber 1.

As shown in FIG. 10, it can be seen that when the metal oxide film is formed on the substrate 2 which is being heated in a low temperature region of at least 220 to 200° C., the sheet resistance of the metal oxide film to be formed decreases more in the second preferred embodiment than in the first preferred embodiment. Though not shown in FIG. 10, it is confirmed that also when the heating temperature for the substrate 2 is 200° C. or lower, the sheet resistance of the metal oxide film to be formed decreases more in the second preferred embodiment than in the first preferred embodiment.

In other words, in the case where the ozone as well as the solution 4 is supplied onto the substrate 2, the sheet resistance of the metal oxide film to be formed can be improved even when the substrate 2 is heated at lower temperature, as compared with the case where no ozone is supplied onto the substrate 2. Especially, when the substrate 2 is heated at 220° C. or lower, the sheet resistance of the metal oxide film formed by the method of the second preferred embodiment is improved by about double digits as compared with the sheet resistance of the metal oxide film formed by the method of the first preferred embodiment.

Further, as can be seen from the configuration shown in FIG. 9, the solution 4 and the ozone are supplied onto the substrate 2 through the different paths L1 and L2, respectively. In the configuration of FIG. 9, the solution 4 is supplied onto the substrate 2 in the reaction chamber 1 through the path L1. On the other hand, the ozone is supplied onto the substrate 2 in the reaction chamber 1 through the path L2.

Thus, by supplying the solution 4 and the ozone onto the substrate 2 through the different paths L1 and L2, the place in which the ozone and the solution 4 are mixed with each other can be limited to the inside of the reaction chamber 1 (where the substrate 2 is provided). In other words, it is possible to prevent the solution 4 and the ozone from being mixed with each other in a path in the course of supply. Therefore, it is possible to cause the reaction of the solution 4 and the ozone only in an area where the substrate 2 is provided, and this improves the reaction efficiency on the substrate 2.

When the solution 4 and the ozone are mixed with each other in the course of supply, in some cases, the solution 4 and the ozone react together to produce an unintended reactant in a gas phase before the solution 4 and the ozone reach the substrate 2. The generation of the unintended reactant prevents the film growth on the surface of the substrate 2 (the deposition of the unintended reactant causes degradation of the film quality and a decrease of the film formation rate). Then, by supplying the solution 4 and the ozone through the different paths L1 and L2, it is possible to suppress generation of such an unintended reactant.

The film formation apparatus 200 may further comprise a control part (not shown) for performing the following control. The control part performs a control so that the misted solution 4 and the ozone may be supplied onto the substrate 2 in the reaction chamber 1 at the same time or at predetermined different timings.

By supplying the misted solution 4 and the ozone onto the substrate 2 in the reaction chamber 1 at the same time, it is possible to fully utilize the ozone reactivity (oxidizability) inside the reaction chamber 1. In contrast to this, by supplying the misted solution 4 and the ozone separately onto the substrate 2 in the reaction chamber 1 at different timings, it is possible to suppress the reaction of the ozone and the solution 4 in a portion other than the surface of the substrate 2.

Further, when the misted solution 4 and the ozone are separately supplied onto the substrate 2 in the reaction chamber 1 at different timings, the ozone reactivity (oxidizability) inside the reaction chamber 1 cannot be fully utilized. By supplying the ozone while heating the substrate 2, however, the properties of the metal oxide film to be formed can be improved (for example, an increase of the crystallinity, and an improvement of the electric resistance depending on the mobility and the carrier concentration).

Though only one solution container 5 is provided in the first and second preferred embodiments, a plurality of solution containers 5 may be provided so as to hold different kinds of solutions. In a case of adopting this constitution, a misting unit is provided in each solution container and an individual path through which the solution is supplied is provided between each solution container and the reaction chamber 1. Further, in the case of adopting this constitution, the solutions may be supplied at the same time or may be supplied separately at different timings in a predetermined order.

In the case of the second preferred embodiment where a plurality of solution containers are provided, the different solutions may be separately supplied in the predetermined order while the ozone is continuously supplied. Alternatively, the different solutions and the ozone may be separately supplied at different timings. In any supplying case, it is preferable that the solutions and the ozone should be supplied onto the substrate 2 in the reaction chamber 1 through different paths.

Further, in the second preferred embodiment, an ultraviolet light generator for emitting ultraviolet light (having a wavelength of about 10 to 400 nm) to the ozone to be supplied onto the substrate 2 may be additionally provided. In the case of adopting this constitution, the ozone is decomposed into oxygen radicals by the emission of the ultraviolet light, and the reaction for the film formation of the metal oxide film can be thereby promoted in the reaction chamber 1 (more specifically, on the first main surface of the substrate 2). Since the ozone to be supplied into the reaction chamber 1 is decomposed into the oxygen radicals by the emission of the ultraviolet light, the heating unit 3 for heating the substrate 2 may be omitted. In terms of the promotion of the reaction, however, it is preferable that the substrate 2 should be heated even in the case of adopting the constitution for the emission of the ultraviolet light. In the case of adopting the constitution for the emission of the ultraviolet light, oxygen may be used, instead of ozone.

Furthermore, in the second preferred embodiment, a plasma generator for plasmatizing the ozone to be supplied onto the substrate 2 may be additionally provided. In the case of adopting this constitution, the ozone is decomposed into oxygen radicals by the plasma, and the reaction for the film formation of the metal oxide film can be thereby promoted in the reaction chamber 1 (more specifically, on the first main surface of the substrate 2). Since the ozone to be supplied into the reaction chamber 1 is decomposed into the oxygen radicals by the plasma, the heating unit 3 for heating the substrate 2 may be omitted. In terms of the promotion of the reaction, however, it is preferable that the substrate 2 should be heated even in the case of additionally providing the plasma generator. In the case of additionally providing the plasma generator, oxygen may be used, instead of ozone.

In a comparison between the metal oxide film (the former film) formed by the film formation method of the first and second preferred embodiments and a metal oxide film (the latter film) formed by a film formation method in which a solution 4 not containing the EDA is used, the amount of nitrogen atoms contained in the former film is larger than the amount of nitrogen atoms contained in the latter film. The increase in the amount of nitrogen atoms is caused by using the solution 4 containing the EDA which contains nitrogen as a composition element in the film formation method of the present invention.

While the invention has been shown and described in detail, the foregoing description is in all aspects illustrative and not restrictive. It is therefore understood that numerous modifications and variations can be devised without departing from the scope of the invention.

DESCRIPTION OF REFERENCE NUMERALS 1 reaction chamber
2 substrate
3 heating unit
4 solution
4a EDA solution
4b source solution
5 solution container
5a, 5b container
6 misting unit
7 ozone generator
L1, L2, L3 path
100, 200 film formation apparatus

The invention claimed is:

1. A method of forming a metal oxide film with a desired mobility, the method comprising:
   supplying a misted solution comprising a metallic element and an amount of ethylenediamine sufficient to provide the desired mobility onto a first main surface of a substrate while heating the substrate,
   wherein
   the amount of ethylenediamine is determined from a relationship showing change in mobility of the metal oxide film with a changing ethylenediamine amount but no significant change in carrier concentration of the metal oxide film with the changing ethylenediamine amount.

2. The method of claim 1, wherein
the metallic element is titanium, zinc, indium, tin, or a combination thereof.

3. The method of claim 1, further comprising:
supplying ozone onto the first main surface of the substrate while simultaneously heating the substrate and supplying the solution.

4. The method of claim 1, wherein the substrate comprises glass, plastic, resin, or a combination thereof.

5. The method of claim 1, wherein the solution further comprises at least one dopant selected from the group consisting of boron, nitrogen, fluorine, magnesium, aluminum, phosphorus, chlorine, gallium, arsenic, niobium, indium, and antimony.

6. The method of claim 3, wherein the substrate is heated at a temperature of 220° C. or lower.

7. The method of claim 3, wherein the substrate is heated at a temperature of from 140 to 220° C.

8. The method of claim 3, wherein the ozone and the solution are supplied onto the first main surface of the substrate at the same time.

9. The method of claim 3, wherein the ozone and the solution are supplied onto the first main surface of the substrate at different timings.

10. The method of claim 3, wherein ozone and the solution are supplied onto the first main surface of the substrate through different paths.

11. The method of claim 3, wherein the ozone to be supplied onto the first main surface of the substrate is decomposed into oxygen radicals by ultraviolet light emitted from an ultraviolet light generator.

12. The method of claim 3, wherein the ozone to be supplied onto the first main surface of the substrate is decomposed into oxygen radicals by plasma generated by a plasma generator.

* * * * *